(12) United States Patent
Min et al.

(10) Patent No.: US 9,929,329 B2
(45) Date of Patent: Mar. 27, 2018

(54) LIGHT EMITTING DEVICE PACKAGE

(71) Applicant: LG INNOTEK CO., LTD., Seoul (KR)

(72) Inventors: Bong Kul Min, Seoul (KR); Won Jung Kim, Seoul (KR); Heung Ju Lee, Seoul (KR); Chang Man Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 173 days.

(21) Appl. No.: 14/476,404

(22) Filed: Sep. 3, 2014

(65) Prior Publication Data
US 2015/0060897 A1   Mar. 5, 2015

(30) Foreign Application Priority Data

Sep. 4, 2013   (KR) .................. 10-2013-0105865

(51) Int. Cl.
| | |
|---|---|
| *H01L 29/18* | (2006.01) |
| *H01L 33/60* | (2010.01) |
| *H01L 33/54* | (2010.01) |
| *H01L 33/62* | (2010.01) |
| *H01L 33/48* | (2010.01) |

(52) U.S. Cl.
CPC .............. *H01L 33/60* (2013.01); *H01L 33/54* (2013.01); *H01L 33/486* (2013.01); *H01L 33/62* (2013.01); *H01L 2224/48091* (2013.01)

(58) Field of Classification Search
CPC ....... H01L 33/54; H01L 33/60; H01L 33/486; H01L 33/62; H01L 2224/48091; H01L 2224/00014

USPC ....................................... 257/88, 98
See application file for complete search history.

(56) References Cited

U.S. PATENT DOCUMENTS

| | | | | |
|---|---|---|---|---|
| 2006/0091410 A1* | 5/2006 | Chen | .................... | H01L 33/642 |
| | | | | 257/95 |
| 2007/0063214 A1* | 3/2007 | Kim | .................... | H01L 33/507 |
| | | | | 257/99 |
| 2007/0194336 A1 | 8/2007 | Shin et al. | | |
| 2008/0128730 A1* | 6/2008 | Fellows | ................. | H01L 33/22 |
| | | | | 257/98 |
| 2012/0069545 A1* | 3/2012 | Choi | ........................ | F21V 3/00 |
| | | | | 362/84 |

(Continued)

FOREIGN PATENT DOCUMENTS

| | | |
|---|---|---|
| CN | 1937268 A | 3/2007 |
| DE | 26 32 462 A | 1/1978 |
| DE | 10 2009 018 088 A | 12/2009 |

(Continued)

*Primary Examiner* — Vongsavanh Sengdara
(74) *Attorney, Agent, or Firm* — Birch, Stewart, Kolasch & Birch, LLP

(57) ABSTRACT

Embodiments relate to a light emitting device package including a first lead frame and a second lead frame spaced apart from each other, a light emitting device disposed on the first lead frame, a reflecting part disposed on the first lead frame and the second lead frame and a light transmitting part including a lower end part disposed on the reflecting part, the first lead frame and the second lead frame and an upper end part disposed on the lower end part. The upper end part has a side surface vertically aligned with a location of a sidewall between upper and lower ends of the reflecting part.

20 Claims, 13 Drawing Sheets

(56) References Cited

U.S. PATENT DOCUMENTS

2013/0037837 A1* 2/2013 Kang .................... H01L 33/486
257/98

FOREIGN PATENT DOCUMENTS

| JP | 2007-88472 A | 4/2007 |
|---|---|---|
| JP | 2011-9143 A | 1/2011 |
| KR | 10-2012-0084526 A | 7/2012 |

* cited by examiner

FIG. 15

| | Case 1 | Case 2 | Case 3 |
|---|---|---|---|
| Design | | | |
| A [mm] | 0.3 | First step: 0.3<br>Second step: 0.3 | First step: 0.3<br>Second step: 0.3 |
| B [°] | 48° | 30° | 0° |
| C [mm] | 1.1 | 1.1 | 1.1 |
| Viewing angle | 138.7° | 148.2° | 160.0° |
| Back-surface flux rate | 2.19% | 2.91% | 3.81% |

FIG. 16

| | Case 1 | Case 2 | Case 3 | Case 4 | Case 5 | Case 6 | Case 7 |
|---|---|---|---|---|---|---|---|
| Image | | | | | | | |
| A [mm] | 0.3 | 0.3 | step:0.3(h1=0.35)<br>2step:0.2(h2=0.7) | step:0.3(h1=0.525)<br>2step:0.2(h2=0.525) | step:0.3(h1=0.7)<br>2step:0.2(h2=0.35) | step:0.3(h1=0.525)<br>2step:0.3(h2=0.525) | step:0.3(h1=0.525)<br>2step:0.4(h2=0.525) |
| B [°] | 36° | 0° | 0° | 0° | 0° | 0° | 0° |
| C [mm] | 0.6 | 1.1 | 1.1 | 1.1 | 1.1 | 1.1 | 1.1 |
| Viewing angle | 145.8° | 163.3° | 158.2° | 160.2° | 160.9° | 158.6° | 156.5° |
| Back-surface flux rate | 1.90% | 4.32% | 3.53% | 3.70% | 3.82% | 3.31% | 3.19% |

FIG. 17

|  | Case 1 | Case 2 | Case 3 | Case 4 | Case 5 | Case 6 | Case 7 |
|---|---|---|---|---|---|---|---|
| Image | | | | | | | |
| A [mm] | 0.3 | 0.3 | 1step: 0.3<br>2step: 0.2 | 1step: 0.3<br>2,3step: 0.2 | 1step: 0.3<br>2,3,4step: 0.2 | 1,2step: 0.3 | 1,2,3step: 0.3 |
| B [°] | 0° | 0° | 0° | 0° | 0° | 0° | 0° |
| C [mm] | 0.6 | 0.6 | 0.6 | 0.6 | 0.6 | 0.6 | 0.6 |
| Viewing angle | 144.6° | 147.1° | 143.3° | 134.0° | 132.0° | 140.9° | 134.9° |
| Back-surface flux rate | 2.57% | 2.22% | 1.70% | 1.08% | 0.81% | 1.50% | 1.03% |

LIGHT EMITTING DEVICE PACKAGE

CROSS REFERENCE TO RELATED APPLICATION

This application claims priority to Korean Patent Application No. 10-2013-0105865, filed in Korea on 4 Sep. 2013, which is hereby incorporated in its entirety by reference as if fully set forth herein.

TECHNICAL FIELD

Embodiments relate to light emitting device packages.

BACKGROUND

Light emitting devices, such as Light Emitting Diodes (LEDs) or Laser Diodes (LDs), which use group III-V or group II-VI compound semiconductors, are capable of emitting light of various colors, such as red, green and blue, ultraviolet light and the like, owing to developments of device materials and thin film growth technologies. Moreover, these light emitting devices are capable of emitting white light with high efficiency through use of a fluorescent substance or color combination, and have advantages of low power consumption, semi-permanent lifespan, fast response time, safety and environmental friendliness as compared to conventional light sources, such as fluorescent lamps, incandescent lamps and the like.

Accordingly, application sectors of light emitting devices are expanded up to transmitting modules of optical communication means, LED backlights to replace Cold Cathode Fluorescence Lamps (CCFLs) which serve as backlights of Liquid Crystal Display (LCD) apparatuses, white LED lighting apparatuses to replace fluorescent lamps or incandescent lamps, head lights of vehicles and traffic lights.

A light emitting device package has widely been used in lighting apparatuses or display apparatuses. The light emitting device package may generally include a body, lead frames located in the body and light emitting devices (e.g., LEDs) located on any one of the lead frames.

SUMMARY

Embodiments provide a light emitting device package which is capable of enhancing a viewing angle and reducing a back-surface flux rate.

In one embodiment, a light emitting device package comprises a first lead frame and a second lead frame spaced apart from each other, a light emitting device disposed on the first lead frame, a reflecting part disposed on the first lead frame and the second lead frame to surround the periphery of the light emitting device, and a light transmitting part including a lower end part disposed on the reflecting part, the first lead frame and the second lead frame and an upper end part disposed on the lower end part, the upper end part having a smaller diameter than a diameter of the lower end part, wherein the upper end part has a side surface vertically aligned with a location of a sidewall of the reflecting part between upper and lower ends of the reflecting part.

The upper end part may include multiple portions stacked one above another in the vertical direction, and the portions are upwardly reduced in diameter in the vertical direction.

A lowermost portion among the portions may have a side surface vertically aligned with a location of a sidewall of the reflecting part between upper and lower ends of the reflecting part.

Two neighboring portions among the portions may have a positional difference in the horizontal direction.

Each of the portions may have a center aligned with the center of the lower end part.

Each of the portions may have a curved corner portion where a side surface and an upper surface thereof meet each other.

Two neighboring portions among the portions may have a positional difference within a range of 0.2 mm to 0.5 mm, and an inclination angle of a side surface of each of the portions on the basis of an upper surface of the lower end part may be within a range of 15° to 50°.

The upper end part may have a center aligned with a center of the lower end part.

The upper end part may have a cylindrical or hexahedral shape.

The upper end part may have a diameter reduced from the bottom to the top.

The upper end part may have a side surface spaced apart from an edge of an upper surface of the lower end part.

The upper end part may have a curved corner portion where a side surface and an upper surface of the upper end part meet each other.

The lower end part may come into contact with an upper surface and a sidewall of the reflecting part and respective upper surfaces of the first and second lead frames.

The light transmitting part may include a phosphor serving to vary a wavelength of light emitted from the light emitting device.

The positional difference between the upper end part and the lower end part may be within a range of 0.2 mm to 0.5 mm, and an inclination angle of the side surface of the upper end part on the basis of an upper surface of the lower end part may be within a range of 15° to 50°, and a height from an upper surface of the reflecting part to an upper surface of the upper end part may be within a range of 0.3 mm to 1.5 mm.

BRIEF DESCRIPTION OF THE DRAWINGS

Arrangements and embodiments may be described in detail with reference to the following drawings in which like reference numerals refer to like elements and wherein:

FIG. 15 shows simulation results of a viewing angle and a back-surface flux rate according to the fourth embodiment;

FIG. 16 shows first simulation results of a viewing angle and a back-surface flux rate according to the first and second embodiments;

FIG. 17 shows second simulation results of a viewing angle and a back-surface flux rate according to the first and second embodiments;

DESCRIPTION OF SPECIFIC EMBODIMENTS

Figure 1:
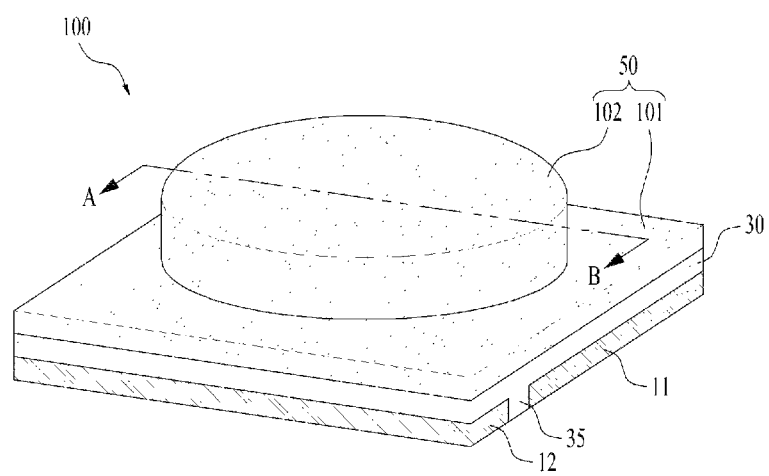
FIG. 1 shows a perspective view of a light emitting device package according to a first embodiment.

Hereinafter, embodiments will be clearly revealed via the following description with reference to the annexed drawings. Prior to description of the embodiments, it will be understood that, when each element, such as a layer (film), region, pattern or structure is referred to as being formed "on" or "under" the other element, such as a substrate, layer (film), region, pad or pattern, it can be directly "on" or "under" the other element or be indirectly formed with intervening one or more other elements therebetween. Also, it will also be understood that "on" or "under" the element may be described relative to the drawings.

In the drawings, the thickness or size of each layer may be exaggerated, omitted or schematically illustrated for clarity and convenience. In addition, the size of each constituent element does not wholly reflect an actual size thereof. In addition, the same or similar elements are denoted by the same reference numerals in the following description of the drawings. Hereinafter, light emitting device packages according to embodiments will be described with reference to the accompanying drawings.

Figure 2:
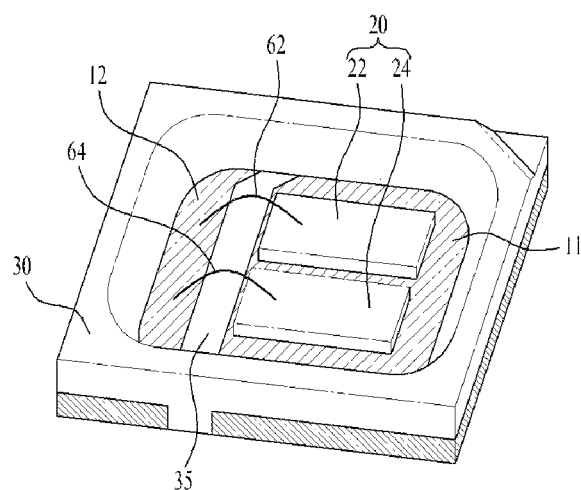
FIG. 2 shows a perspective view after removal of a light transmitting part shown in FIG. 1.
Figure 3A:
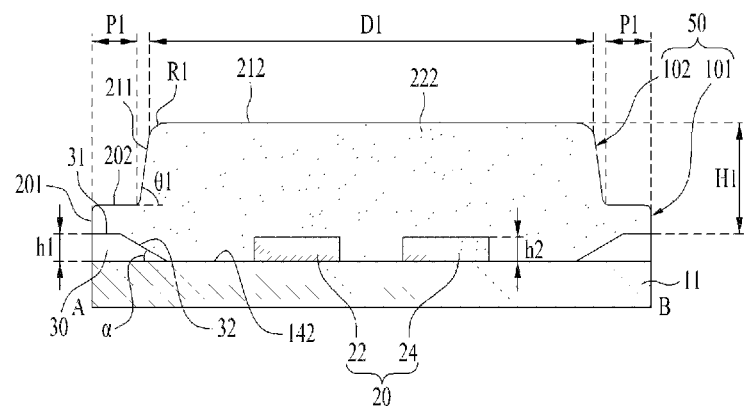
FIG. 3A shows a sectional view of the light emitting device package according to an embodiment shown in FIG. 1 taken along line AB.

FIG. 1 shows a perspective view of a light emitting device package 100 according to a first embodiment, FIG. 2 shows a perspective view after removal of a light transmitting part shown in FIG. 1, and FIG. 3A shows a sectional view of the light emitting device package according to an embodiment shown in FIG. 1 taken along line AB.

Referring to FIGS. 1 to 3A, the light emitting device package 100 includes a first lead frame 11, a second lead frame 12, light emitting devices 20, a reflecting part 30, an isolating part 35, a light transmitting part 50 and wires 62 and 64.

The first lead frame 11 and the second lead frame 12 may be spaced apart from each other so as to be electrically separated from each other.

The light emitting devices 20 may be disposed on an upper surface 142 of the first lead frame 11. As exemplarily shown in FIG. 2, the light emitting devices 20 may be electrically connected to the first lead frame 11 and the second lead frame 12 by the wires 62 and 64.

For example, the first wire 62 may electrically connect a light emitting device 22 and the second lead frame 12 to each other, and the second wire 64 may electrically connect a light emitting device 24 and the second lead frame 12 to each other. However, in other embodiments, the light emitting devices 20 may be electrically connected to the first lead frame 11 and the second lead frame 12 by any of various other methods, such as flip chip, die bonding or the like.

The first lead frame 11 and the second lead frame 12 may be formed of a conductive material, such as a metal. For example, the first lead frame 11 and the second lead frame 12 are formed of at least one of titanium (Ti), copper (Cu), nickel (Ni), gold (Au), chrome (Cr), tantalum (Ta), platinum (Pt), tin (Sn), silver (Ag), phosphorus (P), or alloys thereof. The first lead frame 11 and the second lead frame 12 may have a single layer or multi-layer structure.

The reflecting part 30 may be disposed on the first lead frame 11 and the second lead frame 12 to surround the periphery of the light emitting devices 20 and serve to reflect light emitted from the light emitting devices 20. The reflecting part 30 may have a height h1 equal to or less than a height h2 of the light emitting devices 20, without being limited thereto. In other embodiments, the height h1 of the reflecting part 30 may be greater than the height h2 of the light emitting devices 20.

The reflecting part 30 may expose portions of respective upper surfaces of the first lead frame 11 and the second lead frame 12. The light emitting devices 20 may be located on portions of the upper surface 142 of the first lead frame 11 that are exposed by the reflecting part 30, and the wires 62 and 64 may electrically connect the light emitting devices 20 and portions of the upper surface of the second lead frame 12 that are exposed by the reflecting part 30.

The isolating part 35 may be located between the first lead frame 11 and the second lead frame 12 and may electrically insulate the first lead frame 11 and the second lead frame 12 from each other. The isolating part 35 may be integral with the reflecting part 30 and may constitute a portion of the reflecting part 30.

The reflecting part 30 may include an upper surface 31 and a reflecting sidewall 32. The upper surface 31 may be opposite to a lower surface of the reflecting part 30 that comes into contact with the first lead frame 11, and the reflecting sidewall 32 may face the light emitting devices 20.

The reflecting sidewall 32 may be inclined by an angle α on the basis of the upper surface 142 of the first lead frame 11. For example, the angle α may be an acute angle.

The light transmitting part 50 may be disposed on the reflecting part 30, the first lead frame 11 and the second lead frame 12 to seal and protect the light emitting devices 20.

The light transmitting part 50 may be formed of a translucent moldable material, for example, a colorless transparent polymer resin, such as epoxy or silicone.

The light transmitting part 50 may comprise a phosphor 222 to vary a wavelength of light emitted from the light emitting devices 20. For example, the light transmitting part 50 may comprise at least one of a red phosphor, a green phosphor, yellow phosphor and the like.

The light transmitting part 50 may be increased in height in a stepwise fashion at least one time between the edge and the center thereof. The light transmitting part 50 may include a lower end part 101 and an upper end part 102 stacked one above another in the vertical direction.

The vertical direction may be a direction extending from the first lead frame 11 to the light transmitting part 50, or a direction perpendicular to the upper surface 142 of the first lead frame 11.

The lower end part 101 may be disposed on the reflecting part 30, the first lead frame 11 and the second lead frame 12, and the upper end part 102 may be disposed on the lower end part 101.

An outer circumference of the lower end part 101 may have a shape coincident with a shape of an outer circumference of the reflecting part 30, without being limited thereto. A diameter D1 of the upper end part 102 may be reduced from the bottom to the top. The center of the upper end part 102 may be aligned with the center of the lower end part 101, without being limited thereto.

As will be described below, to achieve a back-surface flux rate of 5% or less in the embodiment, a height H1 from the upper surface 31 of the reflecting part 30 to an upper surface 212 of the upper end part 102 may be within a range of 0.3 mm to 1.5 mm.

When the height to the upper surface 212 of the upper end part 102 is below 0.3 mm, the back-surface flux rate may exceed 5%, thus causing reduction in the quantity of light. In addition, when the height to the upper surface 212 of the upper end part 102 exceeds 1.5 mm, the back-surface flux rate may exceed 5%, thus causing reduction in the quantity of light.

The upper end part 102 and the lower end part 101 may have a positional difference P1 in the horizontal direction. More accurately, a side surface of the upper end part 102 and a side surface of the lower end part 101 may have a positional difference P1 in the horizontal direction. Here, the horizontal direction may be a direction parallel to the upper surface 142 of the first lead frame 11, or a direction perpendicular to the vertical direction.

For example, a side surface 211 of the upper end part 102 may be spaced apart from a side surface 201 of the lower end part 101 by the given distance P1 in the horizontal direction. As will be described below, to achieve a back-surface flux rate of 5% or less in the embodiment, the horizontal positional difference P1 between the lower end part 101 and the upper end part 102 may be within a range of 0.2 mm to 0.5 mm.

When the horizontal positional difference P1 between the lower end part 101 and the upper end part 102 is below 0.2 mm, the back-surface flux rate may exceed 5%, thus causing reduction in the quantity of light.

In addition, when the horizontal positional difference P1 between the lower end part 101 and the upper end part 102 exceeds 0.5 mm, the back-surface flux rate may exceed 5%, thus causing reduction in the quantity of light.

The lower end part 101 may come into contact with the upper surface 31 and the sidewall 32 of the reflecting part 30 and the respective upper surfaces of the first and second lead frames 11 and 12. The side surface 201 of the lower end part 101 may be located in the same plane as the respective side surfaces of the first and second lead frames 11 and 12, although the embodiment is not limited thereto.

To enhance a viewing angle, an upper surface 202 of the lower end part 101 may be located higher than upper surfaces of the light emitting devices 20. For example, on the basis of the upper surfaces of the first and second lead frames 11 and 12, a height of the upper surface 202 of the lower end part 101 may be greater than a height of the upper surfaces of the light emitting devices 20.

The upper surface 202 of the lower end part 101 may be parallel to a horizontal surface. The horizontal surface may be a virtual surface parallel to an upper surface of the first and second lead frames 11 and 12.

Figure 3B:
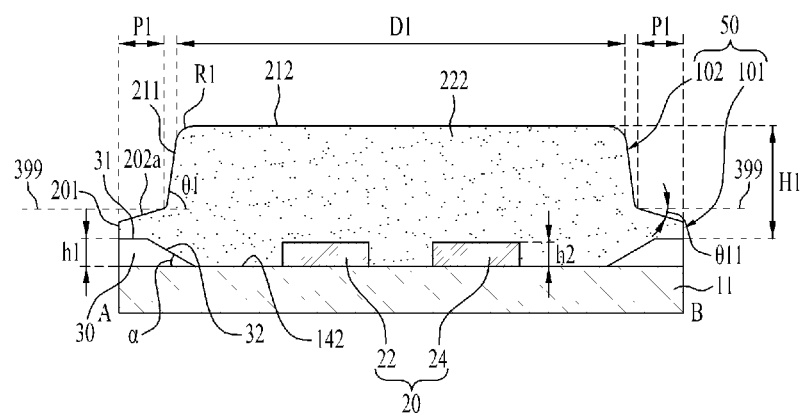
FIG. 3B shows a sectional view of the light emitting device package according to an another embodiment shown in FIG. 1 taken along line AB.

FIG. 3B shows a sectional view of the light emitting device package according to an another embodiment shown in FIG. 1 taken along line AB;

Referring to FIG. 3B, an angle θ11 between the upper surface 202a of the lower end part 101 and a horizontal surface 399 may be greater than 0° and less than 90°. The horizontal surface 399 may be a virtual surface parallel to an upper surface of the first and second lead frames 11 and 12. The back-surface flux rate may be reduced as the angle θ11 increases.

Figure 3C:
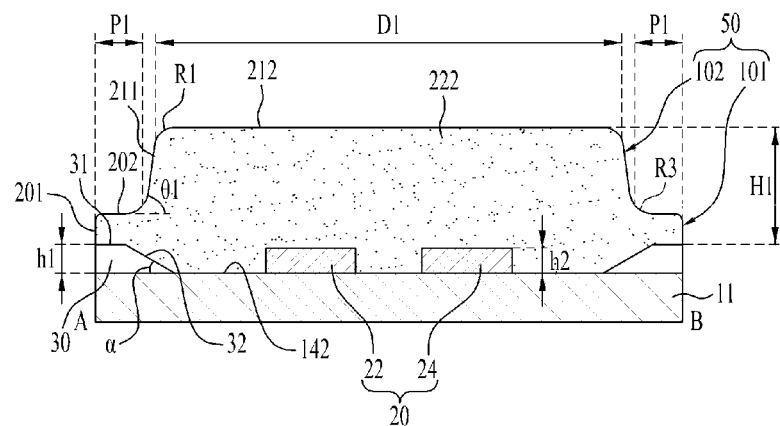
FIG. 3C shows a sectional view of the light emitting device package according to an another embodiment shown in FIG. 1 taken along line AB.

FIG. 3C shows a sectional view of the light emitting device package according to an another embodiment shown in FIG. 1 taken along line AB;

Referring to FIG. 3C, corner portion R3 where the upper surface 202 of the lower end part 101 and the side surface 211 of the upper end part 102 meet each other may be curved.

The side surface 211 of the upper end part 102 may be vertically aligned with or overlap the reflecting part 30. For example, the side surface 211 of the upper end part 102 may be vertically aligned with or overlap the sidewall 32 of the reflecting part 30.

For example, a corner where the side surface 211 of the upper end part 102 and the upper surface 202 of the lower end part 101 meet each other may be vertically aligned with or overlap a location of the sidewall 32 between upper and lower end of the reflecting part 30. This serves to enhance a viewing angle and to reduce the back-surface flux rate that will be described below to within 5%.

An inclination angle θ1 of the side surface 211 of the upper end part 102 on the basis of the upper surface 202 of the lower end part 101 may be greater than 0° and equal to or less than 50°. For example, to achieve a back-surface flux rate of 5% or less in the embodiment, the inclination angle θ1 may be within a range of 15° to 50°.

For example, in the case of 0°<θ1<15°, the back-surface flux rate may depend on values of P1 and H1 to thereby be within 5% or to exceed 5%. In addition, in the case of θ1>50°, the back-surface flux rate may exceed 5%, thus causing reduction in the quantity of light.

However, in the case of 15°≤θ1≤50°, the back-surface flux rate may be within 5% so long as a value of P1 is within a range of 0.2 mm to 0.5 mm and a value of H1 is within a range of 0.3 mm to 1.5 mm, which may prevent reduction in the quantity of light.

A light emitting toward a side and a back faces of the the light transmitting part 50 may be reflected by the reflecting part 30. The back-surface flux rate of 5% or less in the embodiment may be achieved by setting the horizontal positional difference P1, the angle θ1, and the height H1 as described above.

A corner portion R1 where the side surface 211 of the upper end part 102 and the upper surface 212 of the upper end part 102 meet each other may be curved. In this case, a viewing angle may vary based on a radius of curvature of the corner portion R1. To acquire a viewing angle ranging from 130° to 180°, a curvature of the corner portion R1 according to the embodiment may be equal to a curvature of a circle having a radius ranging from 0.1 mm to 0.2 mm.

Figure 4:
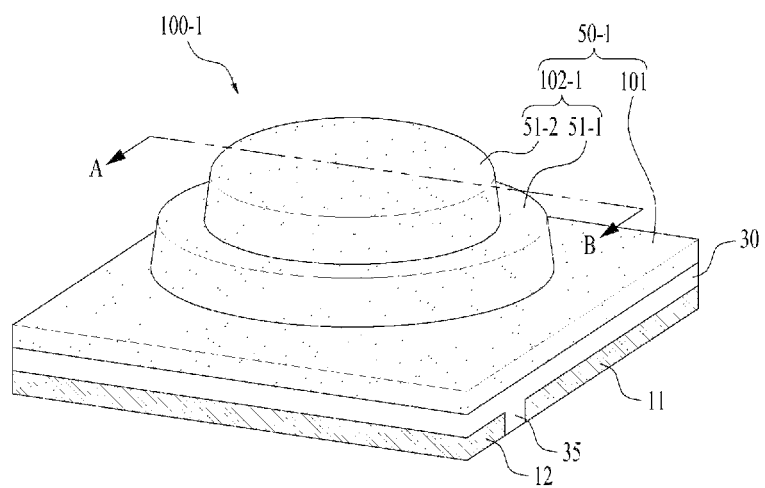
FIG. 4 shows a perspective view of a light emitting device package according to a second embodiment.
Figure 5:
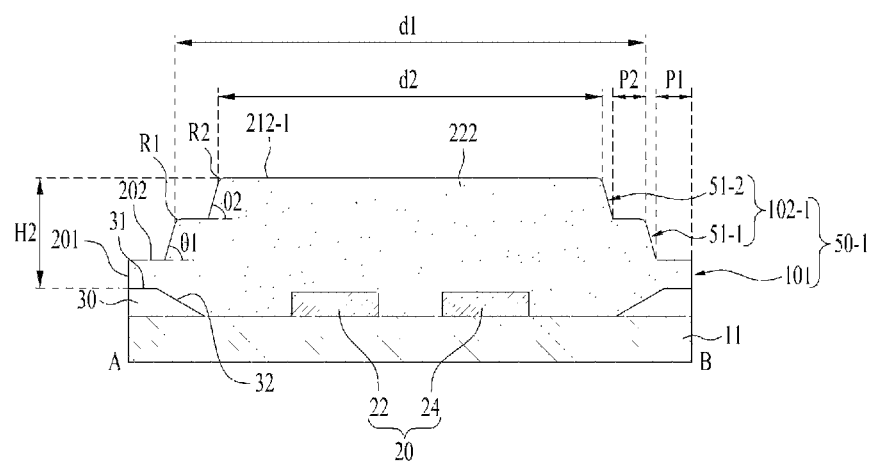
FIG. 5 shows a sectional view of the light emitting device package shown in FIG. 4 taken along line AB.

FIG. 4 shows a perspective view of a light emitting device package 100-1 according to a second embodiment and FIG. 5 shows a sectional view of the light emitting device package 100-1 shown in FIG. 4 taken along line AB.

The same reference numerals as those of FIG. 1 designate the same elements and a description related to the same elements will be briefly provided or omitted.

Referring to FIGS. 4 and 5, the second embodiment 100-1 is an alternative embodiment of the first embodiment 100. In the second embodiment 100-1, an upper end part 102-1 may include multiple portions 51-1 to 51-$n$ ($n$ being a natural number greater than 1) stacked one above another in the vertical direction, the portions 51-1 to 51-$n$ having different diameters. The light transmitting part 50-1 may have a stepped vertical cross section.

The portions 51-1 to 51-$n$ (e.g., $n$=2) may respectively have a cylindrical shape and may be upwardly reduced in diameter in the vertical direction. Centers of the respective portions 51-1 to 51-$n$ (e.g., $n$=2) may be aligned with the center of the lower end part 101.

To achieve the back-surface flux rate of 5% or less in the embodiment, the horizontal positional difference P1 between the lower end part 101 and the upper end part 102-1 may be within a range of 0.2 mm to 0.5 mm.

To achieve the back-surface flux rate of 5% or less in the embodiment, the height H2 from the upper surface 31 of the reflecting part 30 to an upper surface 212-1 of an uppermost portion (e.g., 51-2) of the upper end part 102-1 may be within a range of 0.3 mm to 1.5 mm.

When the height H2 from the upper surface 31 of the reflecting part 30 to the upper surface 212-1 of the uppermost portion (e.g., 51-2) is below 0.3 mm, the back-surface flux rate may exceed 5%, thus causing reduction in the quantity of light. In addition, when the height H2 from the upper surface 31 of the reflecting part 30 to the upper surface 212-1 of the uppermost portion (e.g., 51-2) exceeds 1.5 mm, the back-surface flux rate may exceed 5%, thus causing reduction in the quantity of light.

Two neighboring portions (e.g., 51-1 and 51-2) may have a positional difference P2 in the horizontal direction. More accurately, a side surface of a second portion 51-2 may be spaced apart from a side surface of a first portion 51-1 by a given distance P2 in the horizontal direction.

To achieve the back-surface flux rate of 5% or less in the embodiment, the positional difference P2 between the two neighboring portions (e.g., 51-1 and 51-2) may be within a range of 0.2 mm to 0.5 mm.

When the positional difference P2 between the two neighboring portions (e.g., 51-1 and 51-2) is below 0.2 mm, the back-surface flux rate may exceed 5%, thus causing reduction in the quantity of light. In addition, when the positional difference P2 between the two neighboring portions (e.g., 51-1 and 51-2) exceeds 0.5 mm, the back-surface flux rate may exceed 5%, thus causing reduction in the quantity of light.

Inclination angles (e.g., $\theta 1$ and $\theta 2$) of respective side surfaces of the multiple portions 51-1 to 51-$n$ ($n$ being a natural number greater than 1) on the basis of the upper surface of the lower end part 101 may be greater than 0° and equal to or less than 50°. For example, to achieve the back-surface flux rate of 5% or less in the embodiment, the inclination angles $\theta 1$ and $\theta 2$ may be within a range of 15° to 50°. In the case of 0°<$\theta 1$ and $\theta 2$<15°, the back-surface flux rate may exceed 5%, thus causing reduction in the quantity of light. In addition, in the case of $\theta 1$ and $\theta 2$>50°, the back-surface flux rate may exceed 5%, thus causing reduction in the quantity of light.

Corner portions R1 and R2 where side surfaces and upper surfaces of the respective portions 51-1 to 51-$n$ (e.g., $n$=2) meet each other may be curved. In this case, a viewing angle may vary based on a radius of curvature of the corner portion R1. To acquire a viewing angle ranging from 130° to 180°, a curvature of each corner portion according to the embodiment may be equal to a curvature of a circle having a radius ranging from 0.1 mm to 0.2 mm.

A lowermost portion 51-1 among the portions 51-5 to 51-$n$ (e.g., $n$=2) may be vertically aligned with or overlap the reflecting part 30. For example, a side surface of the lowermost portion 51-1 may be vertically aligned with or overlap the sidewall 32 of the reflecting part 30.

For example, a corner where the side surface of the lowermost portion 51-1 and the upper surface 202 of the lower end part 101 meet each other may be vertically aligned with or overlap a location of the sidewall 32 between upper and lower ends of the reflecting part 30. This serves to enhance a viewing angle and to reduce the back-surface flux rate to within 5%.

Figure 6:
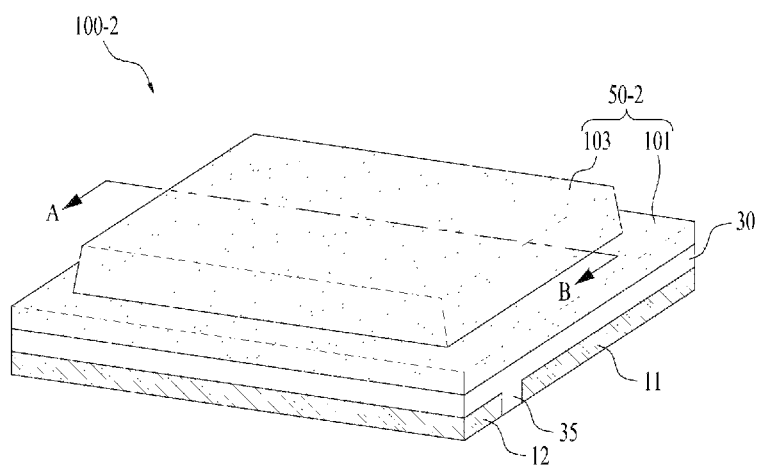
FIG. 6 shows a perspective view of a light emitting device package according to a third embodiment.
Figure 7:
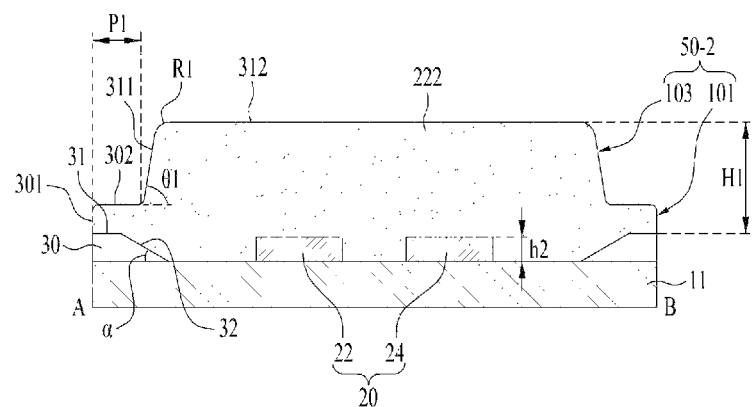
FIG. 7 shows a sectional view of the light emitting device package shown in FIG. 6 taken along line AB.

FIG. 6 shows a perspective view of a light emitting device package 100-2 according to a third embodiment and FIG. 7 shows a sectional view of the light emitting device package 100-2 shown in FIG. 6 taken along line AB.

The same reference numerals as those of FIG. 1 designate the same elements and a description related to the same elements will be briefly provided or omitted.

Referring to FIGS. 6 and 7, a light transmitting part 50-2 of the third embodiment 100-2 includes the lower end part 101 and an upper end part 103. The upper end part 102 of the first embodiment 100 has a cylindrical shape, whereas the upper end part 103 of the third embodiment 100-2 has a hexahedral shape, for example, a regular hexahedral shape, a rectangular shape or a truncated quadrangular pyramidal shape.

The center of the upper end part 103 may be aligned with the center of the lower end part 101, without being limited thereto.

To achieve the back-surface flux rate of 5% or less in the embodiment, a height from the upper surface 31 of the reflecting part 30 to an upper surface 312 of the upper end part 103 may be within a range of 0.3 mm to 1.5 mm.

When the height from the upper surface 31 of the reflecting part 30 to the upper surface 312 of the upper end part 103 is below 0.3 mm, the back-surface flux rate may exceed 5%, thus causing reduction in the quantity of light. In addition, when the height from the upper surface 31 of the reflecting part 30 to the upper surface 312 of the upper end part 103 exceeds 1.5 mm, the back-surface flux rate may exceed 5%, thus causing reduction in the quantity of light.

The lower end part 101 and the upper end part 103 may have the positional difference P1 in the horizontal direction. That is, a side surface 311 of the upper end part 103 may be spaced apart from a side surface 301 of the lower end part 101 by the given distance P1 in the horizontal direction.

To achieve the back-surface flux rate of 5% or less in the embodiment, the horizontal positional difference P1 between the lower end part 101 and the upper end part 103 may be within a range of 0.2 mm to 0.5 mm.

When the horizontal positional difference P1 between the lower end part 101 and the upper end part 103 is below 0.2 mm, the back-surface flux rate may exceed 5%, thus causing reduction in the quantity of light. In addition, when the horizontal positional difference P1 between the lower end part 101 and the upper end part 103 exceeds 0.5 mm, the back-surface flux rate may exceed 5%, thus causing reduction in the quantity of light.

The side surface 311 of the upper end part 103 may be vertically aligned with or overlap the reflecting part 30. For example, the side surface 311 of the upper end part 103 may be vertically aligned with or overlap the sidewall 32 of the reflecting part 30.

An inclination angle θ1 of the side surface 311 of the upper end part 103 on the basis of the upper surface 302 of the lower end part 101 may be greater than 0° and equal to or less than 50°. For example, to achieve the back-surface flux rate of 5% or less in the embodiment, θ1 may be within a range of 15° to 50°.

In the case of 0°<θ1<15°, the back-surface flux rate may exceed 5%, thus causing reduction in the quantity of light. In addition, in the case of θ1>50°, the back-surface flux rate may exceed 5%, thus causing reduction in the quantity of light.

A corner portion R1 where the side surface 311 of the upper end part 103 and an upper surface 312 of the upper end part 103 meet each other may be curved. In this case, a viewing angle may vary based on a radius of curvature of the corner portion R1. To acquire a viewing angle ranging from 130° to 180°, a curvature of the corner portion R1 according to the embodiment may be equal to a curvature of a circle having a radius ranging from 0.1 mm to 0.2 mm.

Figure 8:
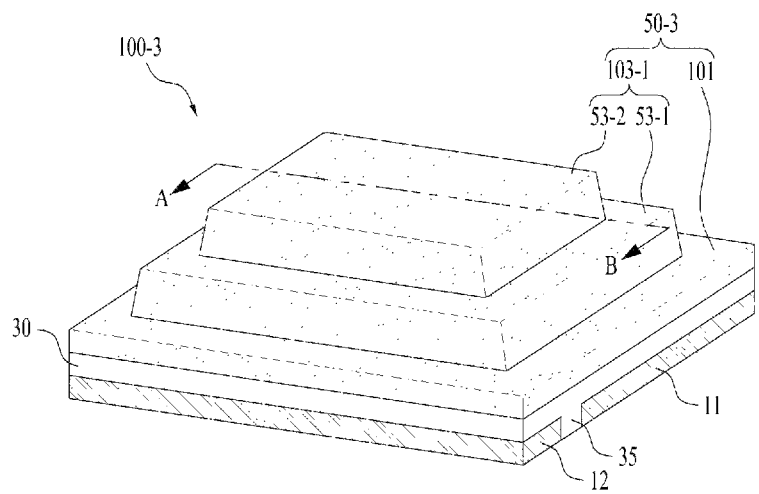
FIG. 8 shows a perspective view of a light emitting device package according to a fourth embodiment.
Figure 9:
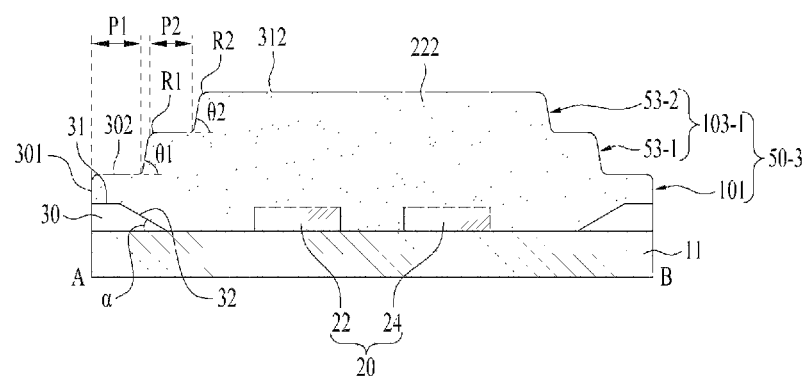
FIG. 9 shows a sectional view of the light emitting device package shown in FIG. 8 taken along line AB.

FIG. 8 shows a perspective view of a light emitting device package 100-3 according to a fourth embodiment and FIG. 9 shows a sectional view of the light emitting device package 100-3 shown in FIG. 8 taken along line AB.

The same reference numerals as those of FIG. 1 designate the same elements and a description related to the same elements will be briefly provided or omitted.

Referring to FIGS. 8 and 9, the fourth embodiment 100-3 is an alternative embodiment of the third embodiment. In the fourth embodiment 100-3, an upper end part 103-1 of a light transmitting part 50-3 may include multiple different portions 53-1 to 53-n (n being a natural number greater than 1) stacked one above another in the vertical direction, the portions 53-1 to 53-n having different areas of upper surfaces (or lower surfaces) thereof.

The respective portions 53-1 to 53-n (n being a natural number greater than 1) may have a hexahedral shape, for example, a regular hexahedral shape, a rectangular shape or a truncated quadrangular pyramidal shape. For example, the upper surfaces (or the lower surfaces) of the respective portions 53-1 to 53-n (n being a natural number greater than 1) may have different lengths of corresponding sides.

The lengths of corresponding sides of the upper surfaces (or the lower surfaces) of the respective portions 53-1 to 53-n (n being a natural number greater than 1) may be reduced upward in the vertical direction.

A height from the upper surface 31 of the reflecting part 30 to an upper surface 312 of the upper end part 103-1, inclination angles of side surfaces of the respective portions 53-1 to 53-n (n being a natural number greater than 1) on the basis of the upper surface of the lower end part 101, the horizontal positional difference P1 between the lower end part 101 and the upper end part 103-1 and the positional difference P2 between two neighboring portions (e.g., 53-1 and 53-2) are identical to the above description with reference to FIGS. 4 and 5.

Figure 10:
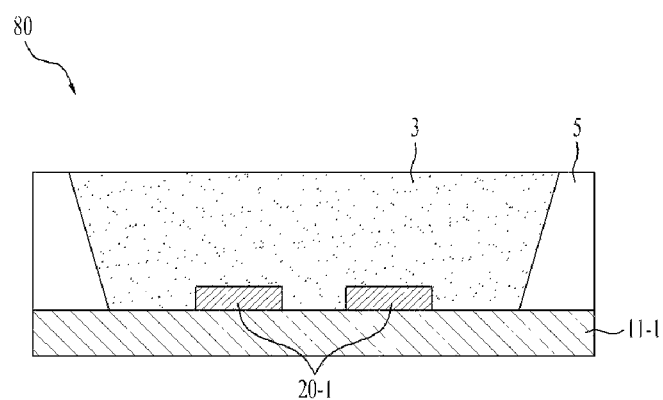
FIG. 10 shows a sectional view of a general light emitting device package.
Figure 11:
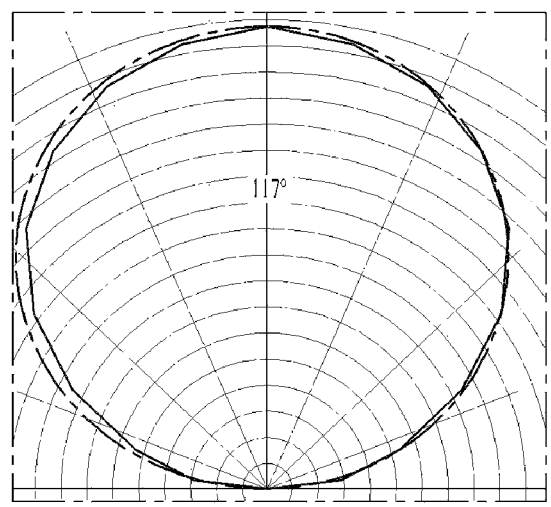
FIG. 11 shows a viewing angle of the light emitting device package shown in FIG. 10.

FIG. 10 shows a sectional view of a general light emitting device package 80 and FIG. 11 shows a viewing angle of the light emitting device package shown in FIG. 10.

Referring to FIGS. 10 and 11, a viewing angle of the light emitting device package 80 may be determined based on a height of a reflecting wall 5 disposed on a lead frame 11-1. The light emitting device package 80 exemplarily shown in FIG. 10 has a configuration in which an upper surface of a molding part 3 is on the same plane as an upper surface of the reflecting wall 5 and a side surface of the molding part 3 is fully surrounded by the reflecting wall 5. Based on experimental results, it will be appreciated that a viewing angle of the light emitting device package 80 shown in FIG. 10 is 117°.

In any one of the embodiments, an enhanced viewing angle of 130° or more may be achieved as a result of reducing a height of the reflecting part 30 to be approximately equal to a height of the light emitting devices 20, opening a side surface of the light transmitting part 50 from the reflecting part 30 and causing a lower surface of the edge of the light transmitting part 50 to come into contact with an upper surface of the reflecting part 30.

Figure 12:
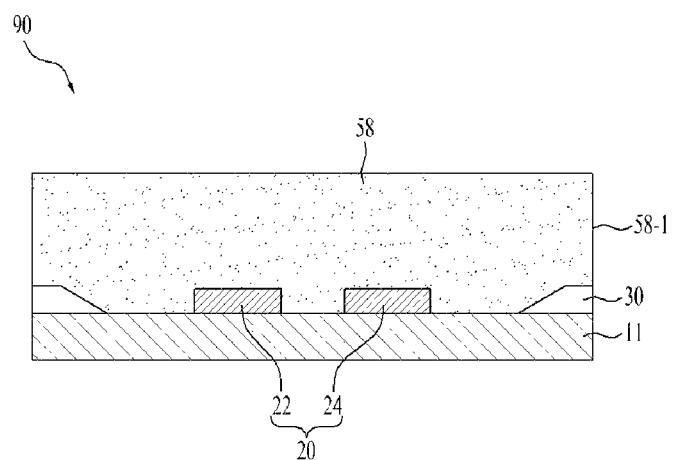
FIG. 12 shows a sectional view of a light emitting device package having an enhanced viewing angle.
Figure 13:
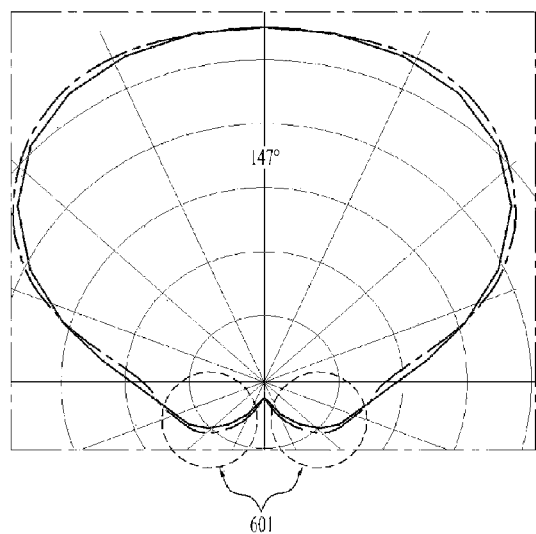
FIG. 13 shows a viewing angle and a back-surface flux rate of the light emitting device package shown in FIG. 12.

FIG. 12 shows a sectional view of a light emitting device package 90 having an enhanced viewing angle and FIG. 13 shows a viewing angle and a back-surface flux rate of the light emitting device package shown in FIG. 12.

Here, the back-surface flux rate may refer to a flux rate of light emitted backward on the basis of a line at which a viewing angle is zero degree.

Referring to FIGS. 12 and 13, the light emitting device package 90 includes the first lead frame 11 and second lead frame (not shown) electrically connected to the light emitting devices 20, the reflecting part 30 disposed on the first and second lead frames 11 and 12 around the light emitting devices 20 and a light transmitting part 58 disposed on the reflecting part 30 and the first and second lead frames 11 and 12 to enclose the light emitting devices 20.

An edge of a lower surface of the light transmitting part 58 may come into contact with an upper surface of the reflecting part 30 and a side surface 58-1 of the light transmitting part 58 may be open from the reflecting part 30. That is, the side surface 58-1 of the light transmitting part 58 may be located on the upper surface of the reflecting part 30.

Through structural differences as described above, a height of the reflecting part 30 shown in FIG. 12 may be less than a height of the reflecting wall 5 shown in FIG. 10 and a viewing angle of the light emitting device package shown in FIG. 12 may be enhanced as compared to the light emitting device package shown in FIG. 10.

It will be appreciated with reference to FIG. 13 that the viewing angle of the light emitting device package shown in FIG. 12 is 147°. When reference to the graph of FIG. 13, it will be appreciated that a back-surface flux rate 601 of the light emitting device package 90 shown in FIG. 12 exceeds 5%.

Figure 14:
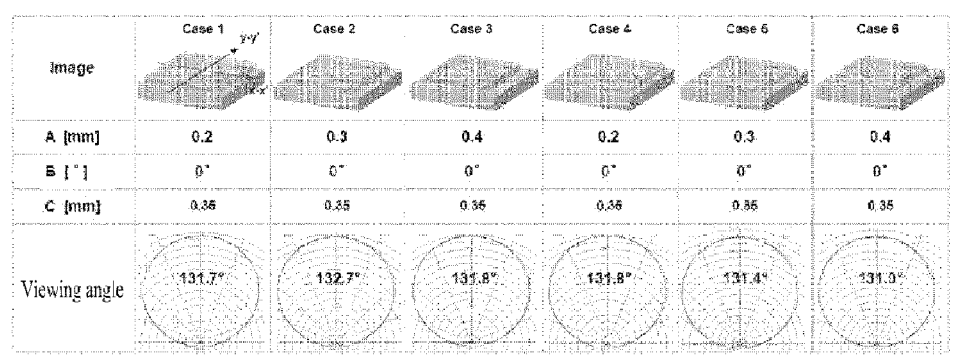
FIG. 14 shows simulation results of a viewing angle and a back-surface flux rate according to the third embodiment.

FIG. 14 shows simulation results of a viewing angle and a back-surface flux rate according to the third embodiment. "A" represents a horizontal positional difference between the lower end part 101 and the upper end part 103, "B" represents an inclination angle of the side surface 311 of the upper end part 103 on the basis of the upper surface of the lower end part 101 and "C" represents a height from the upper surface 31 of the reflecting part 30 to the upper surface 312 of the upper end part 103. In addition, the corner portion R1 where the side surface 311 of the upper end part 103 and the upper surface 312 of the upper end part 103 meet each other in case 1 to case 3 may have a radius of curvature of 0.1 mm and the corner portion R1 in case 4 may have a radius of curvature of 0.2 mm.

Referring to FIG. 14, in case 1 to case 6, "A" may be 0.2 mm, 0.3 mm or 0.4 mm, "B" may be 0° and "C" may be 0.35 mm. It will be appreciated that case 1 to case 6 shown in FIG. 14 have a viewing angle ranging from 0° to 180°.

FIG. 15 shows simulation results of a viewing angle and a back-surface flux rate according to the fourth embodiment.

"A" represents a horizontal positional difference between the lower end part 101 and the upper end part 103-1, "B" represents an inclination angle of the side surfaces 53-1 and 53-2 of the upper end part 103-1 on the basis of the upper surface of the lower end part 101 and "C" represents a height from the upper surface 31 of the reflecting part 30 to the upper surface 312 of the upper end part 103-1.

Referring to FIG. 15, case 1 may correspond to the third embodiment and case 2 and case 3 may correspond to the fourth embodiment.

In case 1 to case 3, "A" may be 0.3 mm, "B" may be 48°, 30° or 0° and "C" may be 1.1 mm. It will be appreciated that case 1 to case 3 shown in FIG. 15 may have a viewing angle ranging from 0° to 180° and a back-surface flux rate of 5% or less.

FIG. 16 shows first simulation results of a viewing angle and a back-surface flux rate according to the first and second embodiments. "A" represents a horizontal positional difference between the lower end part 101 and the upper end part 102, "B" represents an inclination angle of the side surface 211 of the upper end part 102 on the basis of the upper surface of the lower end part 101 and "C" represents a height from the upper surface 31 of the reflecting part 30 to the upper surface 212 of the upper end part 102.

Referring to FIG. 16, in case 1 to case 7, "A" may be 0.2 mm or 0.3 mm, "B" may be 0° or 36° and "C" may be 0.6 mm or 1.1 mm. In this case, the upper end part in case 3 to case 7 may include first and second steps, "h1" may represent a height of the first step and "h2" may represent a height of the second step. It will be appreciated that a viewing angle and a back-surface flux rate may vary based on respective heights of the first and second steps. In addition, it will be appreciated with reference to FIG. 16 that case 1 to case 7 have a viewing angle ranging from 0° to 180° and a back-surface flux rate of 5% or less.

FIG. 17 shows second simulation results of a viewing angle and a back-surface flux rate according to the first and second embodiments.

Referring to FIG. 17, in case 1 to case 7, "A" may be 0.2 mm or 0.3 mm, "B" may be 0° and "C" may be 0.6 mm. In addition, it will be appreciated with reference to FIG. 17 that case 1 to case 7 have a viewing angle ranging from 0° to 180° and a back-surface flux rate of 5% or less.

Figure 18:
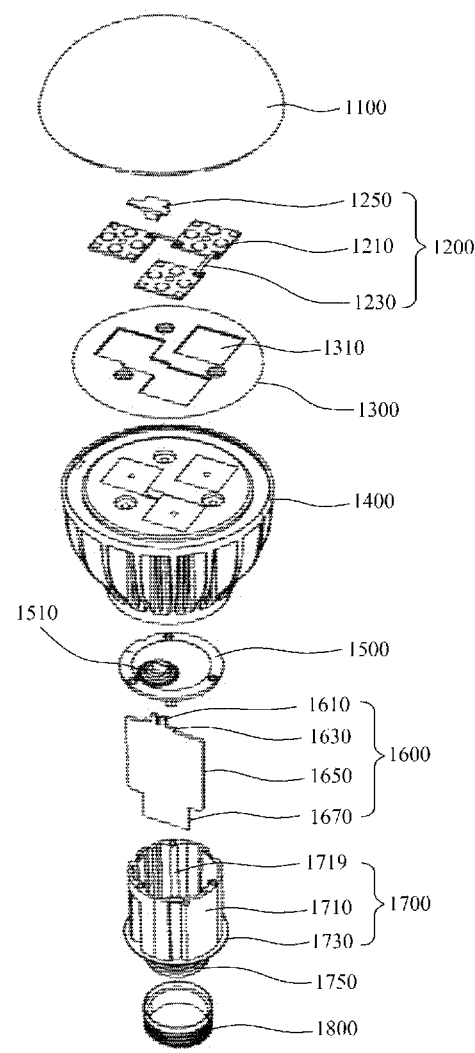
FIG. 18 shows a lighting apparatus including the light emitting device package according to any of the embodiments.

FIG. 18 shows a lighting apparatus including the light emitting device package according to any of the embodiments.

Referring to FIG. 18, the lighting apparatus may include a cover 1100, a light source module 1200, a radiator 1400, a power provider 1600, an inner case 1700 and a socket 1800. In some embodiments, the lighting apparatus may further include a member 1300 and/or a holder 1500.

The cover 1100 may take the form of a hollow bulb or semi-sphere, a portion of which is open. The cover 1100 may be optically coupled to the light source module 1200. For example, the cover 1100 may perform diffusion, scattering or excitation of light emitted from the light source module 1200. The cover 1100 may be a type of optical member. The cover 1100 may be coupled to the radiator 1400. To this end, the cover 1100 may have a coupling portion for the radiator 1400.

The cover 1100 may have an inner surface coated with an ivory white paint. The ivory white paint may comprise a diffuser to diffuse light. The inner surface of the cover 1100 may have a surface roughness greater than a surface roughness of a outer surface of the cover 1100. This serves to sufficiently scatter and diffuse light from the light source module 1200 so as to radiate the light outward.

The cover 1100 may be formed of glass, plastic, polypropylene (PP), polyethylene (PE), polycarbonate (PC) or the like. Here, polycarbonate has high light resistance and heat resistance and strength. The cover 1100 may be transparent to allow the light source module 1200 to be visible from the outside without being limited thereto and the cover 1100 may be opaque. The cover 1100 may be formed by blow molding.

The light source module 1200 may be disposed on one surface of the radiator 1400 and heat generated from the light source module 1200 may be transferred to the radiator 1400 by conduction.

The light source module 1200 may include light source units 1210, connection plates 1230 and a connector 1250. Each of the light source units 1210 may include a board and a plurality of light emitting device packages arranged on the board. The light emitting device packages included in the light source unit 1210 may be based on any one of the above embodiments.

The member 1300 may be disposed on an upper surface of the radiator 1400 and has guide recesses 1310 into which the respective light source units 1210 and the connector 1250 are inserted. The guide recesses 1310 may correspond to or be aligned with the boards of the light source units 1210 and the connector 1250.

A light reflecting material may be applied to or coated over a surface of the member 1300.

For example, a white paint may be applied to or coated over the surface of the member 1300. When light is reflected from the inner surface of the cover 1100 and returned to the light source module 1200, the member 1300 may again reflect the light to the cover 1100. This may result in enhanced luminous efficacy of the lighting apparatus according to the embodiment.

The member 1300 may be formed of an electrical insulating material, for example. The connection plates 1230 of the light source module 1200 may be formed of an electrically conductive material. Thus, electrical contact between the radiator 1400 and the connection plates 1230 may occur. The member 1300 formed of the electrical insulating material may prevent electric short-circuit between the connection plates 1230 and the radiator 1400. The radiator 1400 may radiate heat from the light source module 1200 and heat from the power provider 1600.

The holder 1500 blocks a receiving bore 1719 of an insulating portion 1710 of the inner case 1700. As such, the power provider 1600 received in the insulating portion 1710 of the inner case 1700 may be sealed. The holder 1500 may have a guide protrusion 1510 and the guide protrusion 1510 may have a hole for penetration of a protrusion 1610 of the power provider 1600.

The power provider 1600 processes or converts an external electrical signal to provide the same to the light source module 1200. The power provider 1600 may be received in the receiving bore 1719 of the inner case 1700 and be sealed in the inner case 1700 by the holder 1500. The power provider 1600 may include the protrusion 1610, a guide portion 1630, a base 1650 and an extension 1670.

The guide portion 1630 may protrude outward from one side of the base 1650. The guide portion 1630 may be inserted into the holder 1500. A plurality of elements may be disposed on one surface of the base 1650. The elements, for example, may include a DC converter that converts Alternating Current (AC) power from an external power source into Direct Current (DC) power, a drive chip that controls driving of the light source module 1200, an Electro Static Discharge (ESD) protection element that protects the light source module 1200 and the like, without being limited thereto.

The extension 1670 may protrude outward from the other side of the base 1650. The extension 1670 may be inserted into a connecting portion 1750 of the inner case 1700 and receive an electrical signal from the outside. For example, the extension 1670 may have a width equal to or less than a width of the connecting portion 1750 of the inner case 1700. The extension 1670 may be electrically connected to one end of "a positive electric wire" and one end of "a negative electric wire" and the other ends of "the positive electric wire" and "the negative electric wire" may be electrically connected to the socket 1800.

The inner case 1700 may receive a molding part as well as the power provider 1600 therein. The molding part is prepared by hardening molding liquid and assists the power provider 1600 in being fixed in the inner case 1700.

Figure 19:
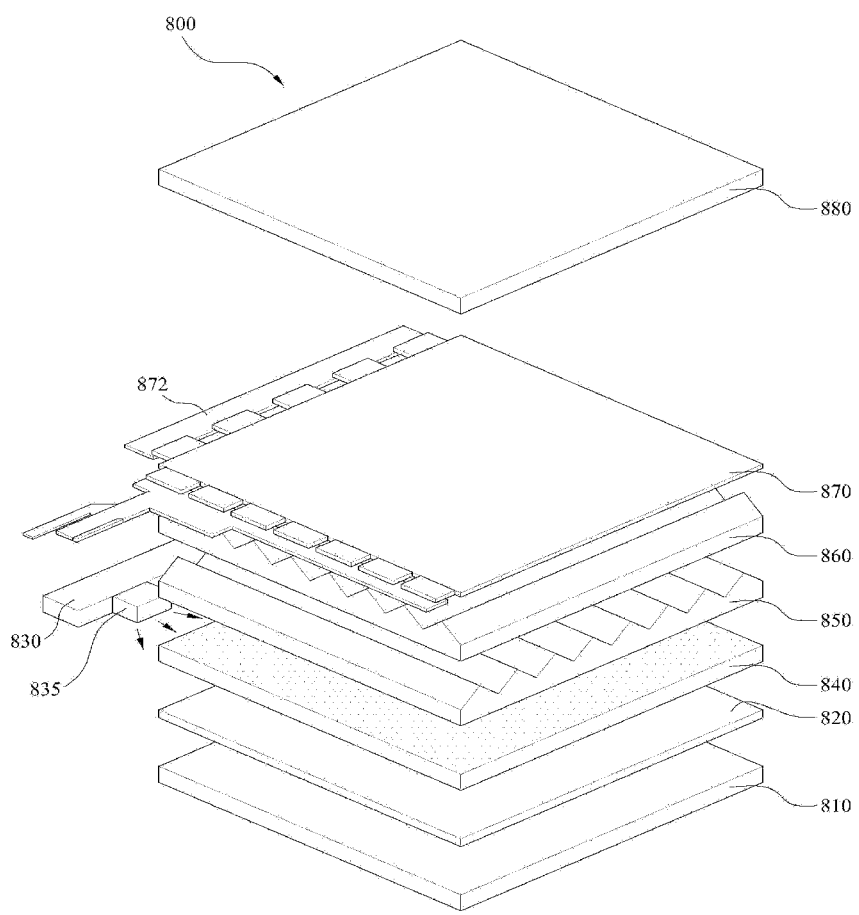
FIG. 19 shows a display apparatus including the light emitting device package according to any of the embodiments.

FIG. 19 shows a display apparatus including the light emitting device package according to any of the embodiments.

Referring to FIG. 19, the display apparatus 800 may include a bottom cover 810, a reflective plate 820 disposed on the bottom cover 810, a light emitting module 830 and 835 to emit light, a light guide plate 840 disposed in front of the reflective plate 820 to guide light emitted from the light emitting module 830 and 835 forward of the display apparatus 800, optical sheets including prism sheets 850 and 860 disposed in front of the light guide plate 840, a display panel 870 disposed in front of the optical sheets, an image signal output circuit 872 connected to the display panel 870 to supply an image signal to the display panel 870 and a color filter 880 disposed in front of the display panel 870. Here, the bottom cover 810, the reflective plate 820, the light emitting module 830 and 835, the light guide plate 840 and the optical sheets may constitute a backlight unit.

The light emitting module may include light emitting device packages 835 mounted on a board 830. Here, the board 830 may be a Printed Circuit Board (PCB) or the like. The light emitting device packages 835 may be based on any one of the above embodiments.

The bottom cover 810 may receive constituent elements of the display apparatus 800. The reflective plate 820 may be a separate element as exemplarily shown in the drawing, or may be a high reflectivity material coated on a back surface of the light guide plate 840 or a front surface of the bottom cover 810.

Here, the reflective plate 820 may be formed of a material which has high reflectivity and may be formed into an ultra thin shape. For example, the reflective plate 820 may be formed of polyethyleneterephthalate (PET).

The light guide plate 840 may be formed of polymethylmethacrylate (PMMA), polycarbonate (PC) polyethylene (PE) or the like.

The first prism sheet 850 may include a support film and a translucent elastic polymer material formed on one surface of the support film. The polymer material may form a prism layer provided with a plurality of repeatedly formed 3-dimensional structures. Here, the structures may define a stripe type pattern including ridges and valleys repeatedly formed as shown.

In addition, in the second prism sheet 850, a direction of ridges and valleys formed on one surface of a support film may be perpendicular to a direction of the ridges and valleys formed on one surface of the support film of the first prism sheet 850. This allows light transmitted from the light emitting module and the reflective plate to be uniformly distributed throughout the display panel 870.

In addition, although not shown, a diffusive sheet may be located between the light guide plate 840 and the first prism sheet 850. The diffusive sheet may be formed of any one of polyester and polycarbonate based materials and may maximize a light projection angle via refraction and scattering of light introduced from the backlight unit. In addition, the diffusive sheet may include a support layer containing a light diffuser and first and second layers formed respectively on a light emission surface (facing the first prism sheet) and a light introduction surface (facing the reflective sheet), the first and second layers containing no light diffuser.

In the embodiment, the diffusive sheet, the first prism sheet 850 and the second prism sheet 860 serve as optical sheets. As examples of other combinations of optical sheets, a micro-lens array, a combination of a diffusive sheet and a micro-lens array, or a combination of a single prism sheet and a micro-lens array may be provided.

The display panel 870 may be a liquid crystal display panel, or may be any one of various other kinds of display devices requiring a light source.

Figure 20:
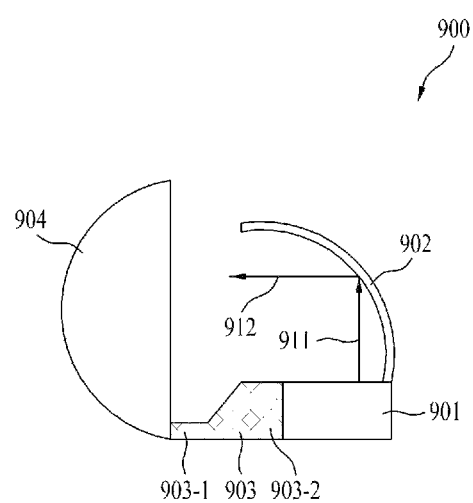
FIG. 20 shows a headlamp including the light emitting device package according to any of the embodiments.

FIG. 20 shows a head lamp 900 including the light emitting device package according to any of the embodiments. Referring to FIG. 20, the head lamp 900 includes a light emitting module 901, a reflector 902, a shade 903 and a lens 904.

The light emitting module 901 may include a plurality of light emitting device packages (not shown) disposed on a board (not shown). In this case, the light emitting device packages may be based on any one of the above embodiments.

The reflector 902 reflects light 911 emitted from the light emitting module 901 in a given direction, for example, in a front direction 912.

The shade 903 is located between the reflector 902 and the lens 904 and serves to block or reflect a portion of light reflected by the reflector 902 to thereby be directed to the lens 904, thereby assisting a designer in configuring a desired light distribution pattern. One side portion 903-1 and the other side portion 903-2 of the shade 903 may have different heights.

Light emitted from the light emitting module 901 is reflected by the reflector 902 and the shade 903 and, thereafter, passes through the lens 904 to thereby be directed forward of a vehicle. The lens 904 may forwardly refract light reflected by the reflector 902.

As is apparent from the above description, the embodiments may enhance a viewing angle and reduce a back-surface flux rate.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
    a first lead frame and a second lead frame spaced apart from each other;
    a light emitting device disposed on the first lead frame;

a reflecting part disposed on the first lead frame and the second lead frame, wherein the reflecting part includes an upper surface and a reflecting sidewall; and a light transmitting part including:

a lower end part disposed on the upper surface of the reflecting part, the first lead frame and the second lead frame, and an upper end part disposed on an upper surface of the lower end part, wherein a lower surface of the lower end part contacts the upper surface of the reflecting part, and a corner where a side surface of the upper end part and the upper surface of the lower end part meet each other is vertically aligned with a portion of the reflecting sidewall of the reflecting part, wherein the portion of the reflecting sidewall is located between an upper end and a lower end of the reflecting sidewall, wherein the upper surface of the lower end part is positioned higher than the upper surface of the reflecting part, wherein the upper end part includes:

a central region located on the upper surface of the lower end part; and a surrounding region surrounding the central region and including a positional difference, wherein the central region and the lower end part have the positional difference in a horizontal direction, and the horizontal direction is a direction parallel to an upper surface of the first lead frame, wherein the central region has a first height and the first height is a height from the upper surface of the reflecting part to an upper surface of the central part, wherein a ratio between the positional difference and the first height is 1:0.6-1:7.5, and wherein an inclination angle of the side surface of the central region on the basis of an upper surface of the lower end part is within a range of 15° to 50°.

2. The light emitting device package according to claim 1, wherein the central region of the upper end part has a center aligned with a center of the lower end part.

3. The light emitting device package according to claim 1, wherein the central region of the upper end part has a cylindrical or hexahedral shape.

4. The light emitting device package according to claim 1, wherein the positional difference between the upper end part and the lower end part is within a range of 0.2 mm to 0.5 mm, and wherein the first height is within a range of 0.3 mm to 1.5 mm.

5. The light emitting device package according to claim 1, wherein the central region of the upper end part includes multiple portions stacked one above another in a vertical direction, and the portions are upwardly reduced in diameter in the vertical direction, and wherein the central region of the upper end part has a stepped vertical cross section.

6. The light emitting device package according to claim 5, wherein two neighboring portions among the portions have a positional difference in the horizontal direction.

7. The light emitting device package according to claim 5, wherein each of the portions has a center aligned with the center of the lower end part.

8. The light emitting device package according to claim 5, wherein each of the portions has a curved corner portion where a side surface and an upper surface thereof meet each other.

9. The light emitting device package according to claim 5, wherein two neighboring portions among the portions have a positional difference within a range of 0.2 mm to 0.5 mm, and wherein an inclination angle of a side surface of each of the portions on the basis of the upper surface of the lower end part is within a range of 15° to 50°.

10. The light emitting device package according to claim 1, wherein the lower surface of the lower end part directly contacts the upper surface of the reflecting part.

11. A light emitting device package comprising:

a first lead frame and a second lead frame spaced apart from each other;

a light emitting device disposed on the first lead frame;

a reflecting part disposed on the first lead frame and the second lead frame to surround the periphery of the light emitting device, wherein the reflecting part includes an upper surface and a reflecting sidewall; and a light transmitting part including:

a lower end part disposed on the upper surface of the reflecting part, the first lead frame and the second lead frame, and an upper end part disposed on an upper surface of the lower end part, the upper end part having a smaller diameter than a diameter of the lower end part, wherein a lower surface of the lower end part contacts the upper surface of the reflecting part, and a corner where a side surface of a lowermost portion among the multiple portions and the upper surface of the lower end part meet each other is vertically aligned with a portion of the reflecting sidewall of the reflecting part, wherein the portion of the reflecting sidewall is located between an upper end and a lower end of the reflecting sidewall, wherein the upper surface of the lower end part is positioned higher than the upper surface of the reflecting part, the upper end part includes:

a central region located on the upper surface of the lower end part and including multiple portions stacked one above another in a vertical direction, the multiple portions having different diameters; and a surrounding region surrounding the central region and including a first positional difference, wherein the central region and the lower end part have the first positional difference in a horizontal direction, and the horizontal direction is a direction parallel to an upper surface of the first lead frame, wherein the central region has a first height and the first height is a height from the upper surface of the reflecting part to an upper surface of an uppermost portion of the central part, wherein a ratio between the first positional difference and the first height is 1:0.6-1:7.5, and wherein an inclination angle of respective side surfaces of the multiple portions of the upper end part on the basis of the upper surface of the lower end part is within a range of 15° to 50°.

12. The light emitting device package according to claim 11, wherein the central region of the upper end part has a side surface spaced apart from an edge of an upper surface of the lower end part.

13. The light emitting device package according to claim 11, wherein the central region of the upper end part has a diameter reduced from the bottom to the top.

14. The light emitting device package according to claim 11, wherein the central region of the upper end part has a curved corner portion where a side surface and an upper surface of the upper end part meet each other.

15. The light emitting device package according to claim 11, wherein each of the multiple portions has a center aligned with a center of the lower end part.

16. The light emitting device package according to claim 15, wherein the first positional difference is within a range of 0.2 mm to 0.5 mm,
wherein two neighboring portions among the multiple portions of the upper end part have a horizontal positional difference ranging from 0.2 mm to 0.5 mm,
wherein the first height is within a range of 0.3 mm to 1.5 mm.

17. The light emitting device package according to claim 11, wherein the lower end part comes into contact with an upper surface and the reflecting sidewall of the reflecting part and respective upper surfaces of the first and second lead frames.

18. The light emitting device package according to claim 11, wherein the upper end part has a stepped vertical cross section.

19. The light emitting device package according to claim 11, wherein the multiple portions include a first portion and a second portion on the first portion,
wherein the first portion and the second portion have a second positional difference in the horizontal direction, and
wherein a ratio between the first positional difference and the second positional difference is 1:0.4-1:2.5.

20. A lighting apparatus comprising:
a light source module having a board and a plurality of light emitting device packages disposed on the board;
a radiator configured to radiate heat generated from the light source module; and
a cover configured to diffuse light emitted from the light source module,
wherein each of the light emitting device packages includes:
a first lead frame and a second lead frame spaced apart from each other;
a light emitting device disposed on the first lead frame;
a reflecting part disposed on the first lead frame and the second lead frame, wherein the reflecting part includes an upper surface and a reflecting sidewall; and
a light transmitting part including:
a lower end part disposed on the upper surface of the reflecting part, the first lead frame and the second lead frame, and
an upper end part disposed on an upper surface of the lower end part,
wherein a lower surface of the lower end part contacts the upper surface of the reflecting part, and a corner where a side surface of a lowermost portion among the multiple portions and the upper surface of the lower end part meet each other is vertically aligned with a first portion of the reflecting sidewall of the reflecting part,
wherein the portion of the reflecting sidewall is located between an upper end and a lower end of the reflecting sidewall
wherein the upper surface of the lower end part is positioned higher than the upper surface of the reflecting part,
wherein the upper end part includes;
a central region located on the upper surface of the lower end part; and
a surrounding region surrounding the central region and including a positional difference,
wherein the central region and the lower end part have the positional difference in a horizontal direction, and the horizontal direction is a direction parallel to an upper surface of the first lead frame,
wherein the central region has a first height and the first height is a height from the upper surface of the reflecting part to an upper surface of the central part,
wherein a ratio between the positional difference and the first height is 1:0.6-1:7.5, and
wherein an inclination angle of the side surface of the central region on the basis of an upper surface of the lower end part is within a range of 15° to 50°.

* * * * *